（12） United States Patent
Gerrard

(10) Patent No.: US 11,128,973 B2
(45) Date of Patent: Sep. 21, 2021

(54) PRE-PROCESS CORRECTION AND ENHANCEMENT FOR IMMERSIVE AUDIO GREETING CARD

(71) Applicant: Dolby Laboratories Licensing Corporation, San Francisco, CA (US)

(72) Inventor: Mark William Gerrard, Balmain (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 201 days.

(21) Appl. No.: 16/306,162

(22) PCT Filed: May 24, 2017

(86) PCT No.: PCT/US2017/034168
§ 371 (c)(1),
(2) Date: Nov. 30, 2018

(87) PCT Pub. No.: WO2017/210052
PCT Pub. Date: Dec. 7, 2017

(65) Prior Publication Data
US 2020/0329327 A1      Oct. 15, 2020

Related U.S. Application Data

(60) Provisional application No. 62/345,164, filed on Jun. 3, 2016.

(30) Foreign Application Priority Data

Jun. 3, 2016   (EP) .................................. 16172918

(51) Int. Cl.
*H04R 5/02*    (2006.01)
*H04S 7/00*    (2006.01)
*H03G 5/16*    (2006.01)

(52) U.S. Cl.
CPC ............... *H04S 7/30* (2013.01); *H03G 5/16* (2013.01); *H04R 5/02* (2013.01); *H04S 2420/01* (2013.01)

(58) Field of Classification Search
CPC ......... H04S 7/30; H04S 2420/01; H03G 5/16; H04R 5/02
(Continued)

(56) References Cited

U.S. PATENT DOCUMENTS 8,798,274 B2    8/2014   Sakai
2005/0157891 A1   7/2005   Johansen
(Continued)

FOREIGN PATENT DOCUMENTS

AU    2011101087    10/2011
JP    2006-157574    6/2006
(Continued)

*Primary Examiner* — Ammar T Hamid

(57) ABSTRACT

A method of pre-processing audio for playback through an audio greeting card having at a speaker array of two or more speakers and an audio control circuit, by defining one or more device parameters associated with the greeting card, measuring an audio response from the greeting card when playing an original audio file, deriving correction gains to correct magnitude response characteristics of the audio response, deriving compressor threshold values to minimize level distortion of the audio response, deriving a virtualization transfer function from the one or more device parameters, and applying the correction gains, compressor threshold values, and the virtualization transfer function to generate an output audio file.

16 Claims, 5 Drawing Sheets

(58) Field of Classification Search
USPC .................................................. 381/300, 301
See application file for complete search history.

(56) References Cited

U.S. PATENT DOCUMENTS

| | | | | |
|---|---|---|---|---|
| 2005/0286713 A1* | 12/2005 | Gunn | ................... | H04M 1/6016 379/406.04 |
| 2009/0205230 A1 | 8/2009 | Driessen | | |
| 2011/0209365 A1 | 9/2011 | Marsh | | |
| 2012/0014527 A1* | 1/2012 | Furse | ........................ | H04S 7/00 381/17 |
| 2013/0239448 A1 | 9/2013 | Davis | | |
| 2015/0030165 A1* | 1/2015 | Risberg | .................... | H04R 5/04 381/58 |
| 2015/0078596 A1 | 3/2015 | Sprogis | | |

FOREIGN PATENT DOCUMENTS

| | | | | |
|---|---|---|---|---|
| WO | 2008/122188 | | 10/2008 | |
| WO | WO-2008122188 A1 * | | 10/2008 | ........... B42D 15/022 |
| WO | 2013/049125 | | 4/2013 | |
| WO | 2013/106366 | | 7/2013 | |

\* cited by examiner

PRE-PROCESS CORRECTION AND ENHANCEMENT FOR IMMERSIVE AUDIO GREETING CARD

CROSS-REFERENCE TO RELATED APPLICATIONS

This application claims priority to European Patent application No. 16172918.1 filed 3 Jun. 2016 and U.S. Patent Application No. 62/345,164 filed 3 Jun. 2016 which are hereby incorporated by reference in their entirety.

FIELD OF THE INVENTION

One or more embodiments relate generally to audio greeting cards, and more specifically to pre-processing tools to enhance audio playback of spatial audio content in audio greeting cards.

BACKGROUND

Musical greeting cards are paper or cardboard cards that contain a small circuit that plays a song or sings a greeting. Most musical greeting cards comprise a small (e.g., six-pin) microprocessor that is programmed with a melody to be played back through a piezo-electric speaker. A small battery (e.g., lithium button cell) provides the power and a leaf switch closes when the card is opened, turning the music on. Musical greeting cards have been around for many years but their perception has been blighted by poor quality audio reproduction, which results in unsatisfactory or cheap expression of the intended sentiments. An obvious solution to this problem is to utilize better loudspeakers in the card or add more speakers for a bigger sound. However, these additional bill-of-material costs are unattractive solutions to the high-margin greeting card industry.

These methods are also unable to compensate for the speaker constraints due to the product itself, such as how the greeting card interacts with the timbre of the musical content. Present musical greeting cards are also unable to enhance the playback to present an immersive effect, such as may be available in newer digital audio formats, such as spatial audio formats.

In WO2013106366 (A1), systems and methods for enhancing the audio experience on a consumer electronic device are disclosed. More particularly, systems and methods for optimizing the audio performance of individual consumer electronic devices as part of a manufacturing process and/or retail experience are disclosed. A system for enhancing the audio performance of a consumer electronic device including a parametrically configurable processing block is disclosed.

WO2013049125 (A1) describes a system and method for enhancing the audio experience on a consumer electronic device, too. A system for enhancing the audio experience on a consumer electronic device including a parametrically configurable processing block is disclosed. An all-digital audio enhancement system suitable for embedding into a low cost, low power application specific integrated circuit is disclosed. A method for configuring an audio enhancement system on a consumer electronic device is also disclosed.

WO2008122188 (A1) describes a stereo music card including a card, a circuit board disposed thereon, a dual-channel chip in the board, and two speakers connected to the chip. Said card may have two pages or three pages, so two speakers could be both installed in the interlayer of the two-page card or be installed respectively on two lateral pages. The two speakers could attain good stereo acoustics.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions. Dolby and Atmos are registered trademarks of Dolby Laboratories Licensing Corporation.

BRIEF SUMMARY OF EMBODIMENTS

Embodiments are directed to a method of pre-processing audio for playback through a greeting card having at least one speaker and an audio control circuit, by measuring an audio response from the at least one speaker, analyzing the measured audio response with one or more device parameters related to playback from the greeting card, comparing the analyzed audio response with an original audio file, and generating tuning coefficients for input to the audio control circuit to apply to the original audio file to correct for audio playback deficiencies associated with the one or more device parameters.

In case the greeting card comprises at least two speakers, the method of pre-processing audio for playback through the greeting card may output a virtualized version of the original audio file configured to produce speaker virtualization effects enabling and enhancing playback of spatial audio content. At this, a virtualization transfer function may be derived from the one or more device parameters and the virtualized version of the original audio file may be generated by applying the virtualization transfer function to the original audio file. More particularly, the virtualization transfer function may be derived based on at least one head related transfer function HRTF and the one or more device parameters.

The one or more device parameters may comprise a speaker angle associated with a distance between the two speakers and an estimated distance between the greeting card and a listener. The virtualization transfer function may be derived based on at least one head related transfer function HRTF which is based on the speaker angle. Said distance between the two speakers may be determined when the greeting card is in an "open" position to project sound to a listener. In case the greeting card is folded into two halves, a typical "open" position is e.g. characterized in that both halves form an angle between 90 and 180 degree. As a consequence, the distance between the two speakers may be smaller or equal to the sum of the distances of between the speakers and the center fold of the greeting card. If the greeting card comprises 3 pages, the speakers may be installed in the two outer pages, wherein the inner page may increase the distance between the speakers significantly.

Using device parameters (and in particular the speaker angle) for deriving the virtualization transfer function enables enhancing playback of spatial audio content in a simple but efficient manner. As greeting cards are usually help in a similar position (i.e. angle and distance) relative to the head of a listener, and as this position may be determined efficiently using experiments with a large number of listeners, playback of spatial audio may be optimized by the proposed pre-processing method. As a result, the generated virtualized version of the original audio file may be uploaded to a plurality of greeting cards.

The greeting card comprises a paper card folded in half to form an inner surface and an outer surface, and the at least one speaker comprises two speakers placed such that each speaker is in an opposite interior fold of the greeting card to project sound to a listener when the card is opened. The one or more device parameters may comprise at least one of a size of each speaker, a distance between the two speakers, a composition of the two speakers, a material of the card, a weight of the material, and a dimension of the card. The original audio file may be a digitized sound file comprising one of a stereo audio file, a channel-based audio file, an object-based audio file, and a spatial audio file. The method further comprises applying gain values through linear filters and compression through nonlinear filters to correct for frequency distortion and suboptimal volume levels of the original audio file when played through the one or more speakers; and applying a virtualization transfer function derived from a head related transfer function (HRTF) to optimize playback of object or spatial audio through the one or more speakers. Put in a different way, the virtualization transfer function may be derived by both the one or more device parameters and a head related transfer function HRTF, resulting in a virtualization transfer function which is tailored to the peculiarities of greeting cards and the way greeting cards are typically held by listeners.

The audio content may comprise spatial audio having certain height cue audio components, and the one or more speakers may comprise an array of speakers having at least some speakers playing the height cue audio components. The method may further comprise watermarking the processed file by adding a signature audio signal to an out-of-band portion of the audio playback range of the one or more speakers.

Embodiments are also directed to a method of pre-processing audio for playback through an audio greeting card having at a speaker array of two or more speakers and an audio control circuit, by defining one or more device parameters associated with the greeting card, measuring an audio response from the greeting card when playing an original audio file, deriving correction gains to correct magnitude response characteristics of the audio response, deriving compressor threshold values to minimize level distortion of the audio response, deriving a virtualization transfer function from the one or more device parameters, and applying the correction gains, compressor threshold values, and the virtualization transfer function to generate an output audio file. For this method, the correction gains create a flat frequency response for the output audio file when played through the speaker array of the greeting card, the compressor threshold values create a non-distorted volume response for the output audio file when played through the speaker array of the greeting card, and the virtualization transfer function comprises a head related transfer function (HRTF) that simulates surround sound playback from the speaker array of the greeting card. The correction gains, compressor threshold values, and virtualization transfer function comprise tuning parameters for modifying the original audio file. The method may further comprise applying the tuning parameters to other greeting cards related to the greeting card and programmed to playback the original audio file.

Embodiments are yet further directed to a greeting card having one or more speakers for playback of a sound file, a battery to power playback of sound, a memory storing a digitized version of the sound file, and a control circuit tuned to correct deficiencies in playback of the sound file, through a process comprising: measuring audio response from the at least one speaker, deriving from the measured audio response correction gains to correct magnitude response characteristics of the audio response and compressor threshold values to minimize level distortion of the audio response, defining one or more device parameters and deriving a virtualization transfer function from the one or more device parameters.

Embodiments are yet further directed to methods of making and using or deploying the immersive audio greeting cards in accordance with certain methods, processes, components, and products described herein.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
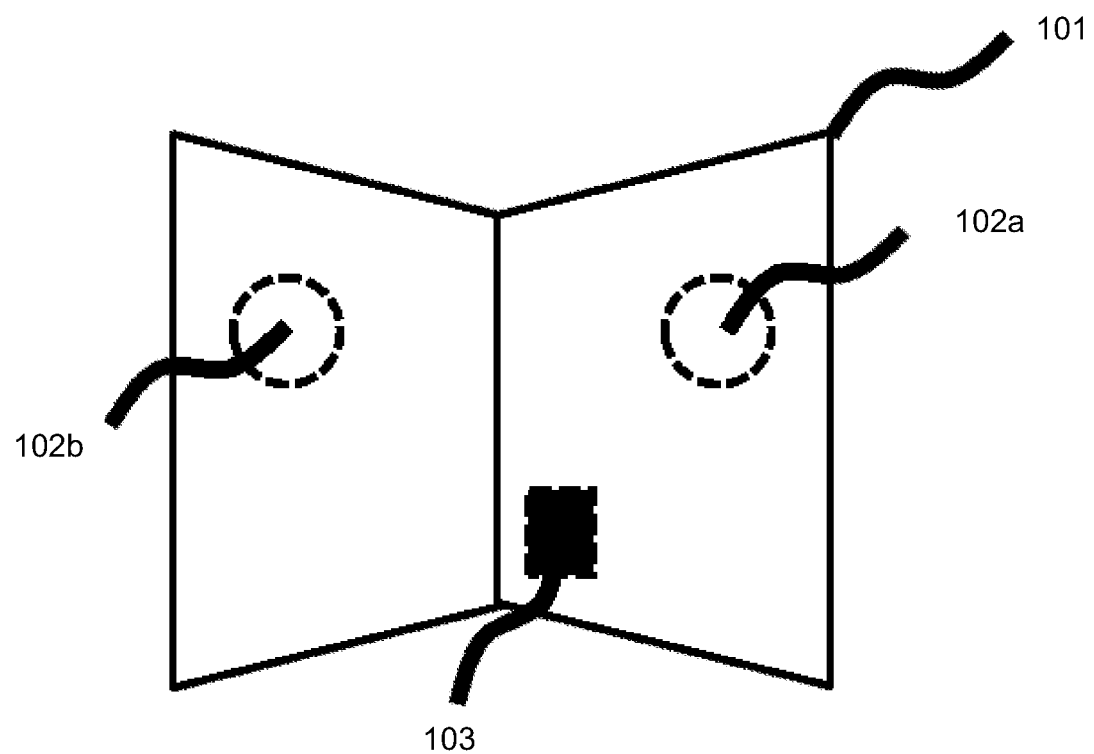
FIG. 1 illustrates a greeting card having stereo speakers and a tuned audio circuit, under some embodiments.

Embodiments are described for an audio or musical greeting card that has a speaker array (e.g., stereo speakers), memory for storing songs or audio content, and an audio circuit that is tuned to correct for deficiencies of the original audio content by taking objective measurements of the acoustic properties of the card and applying equalization and compression effects, as well as speaker virtualization effects to enable and enhance playback of spatial audio content. Certain post-processing technologies, typically used in real-time playback of content, are thus used to solve the problem of poor audio quality on the typically low cost form factor of a paper greeting card.

Aspects of the one or more embodiments described herein may be implemented as a process or sub-process of an audio or audio-visual (AV) system that processes source audio information in a mixing, rendering and playback system that includes one or more computers or processing devices executing software instructions. Such a process may be used to produce or modify audio playback products, such as audio greeting cards or similar products. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

In general, many different types of audio content may be played through audio greeting cards, such as short songs, dialog, sound effects, and so on. In present cards, form factor constraints limit the quality of audio rendering due to the use of small, low-powered speakers, and an inherently non-resonant body, i.e., the paper card itself. This severely limits the ability of cards to satisfactorily play anything more than low-fi songs or messages. In an embodiment, an audio greeting card is optimized to playback more sophisticated audio content, such as channel and object-based audio. Embodiments are directed to audio cards that are tuned to play next generation spatial audio (also referred to as "immersive audio") formats that have been developed to mix of audio objects and traditional channel-based speaker feeds along with positional metadata for the audio objects. For this format, in a spatial audio decoder, the channels are sent directly to their associated speakers or down-mixed to an existing speaker set, and audio objects are rendered by the decoder in a flexible manner. The parametric source description associated with each object, such as a positional trajectory in 3D space, is taken as an input along with the number and position of speakers connected to the decoder. The renderer utilizes certain algorithms to distribute the audio associated with each object across the attached set of speakers. The authored spatial intent of each object is thus optimally presented over the specific speaker configuration that is present in the listening environment. Although spatial audio systems have generally been developed for cinema use, audio content and rendering circuits are being developed to facilitate playback in smaller environments and devices, such as home environments and even small portable devices such as mobile phones, tablet computers, and so on.

Embodiments are directed to a pre-processing method and system for sound rendering through greeting cards that is configured to work with a sound format and processing system that may be referred to as a "spatial audio system" or "immersive audio system" that is based on an audio format and rendering technology to allow enhanced audience immersion, greater artistic control, and system flexibility and scalability. In general, audio objects can be considered as groups of sound elements that may be perceived to emanate from a particular physical location or locations in the listening environment. Such objects can be static (stationary) or dynamic (moving). Audio objects are controlled by metadata that defines the position of the sound at a given point in time, along with other functions. When objects are played back, they are rendered according to the positional metadata using the speakers that are present, rather than necessarily being output to a predefined physical channel. In an embodiment, the audio objects that have spatial aspects including height cues may be also referred to as "diffused audio." Such diffused audio may include generalized height audio such as ambient overhead sound (e.g., wind, rustling leaves, etc.) or it may have specific or trajectory-based overhead sounds (e.g., birds, lightning, etc.). An example of a spatial audio format that may be reproduced at least in part with present embodiments is embodied in the commercially-available Dolby Atmos system.

FIG. 1 illustrates a greeting card having stereo speakers and a tuned audio circuit, under some embodiments. As shown in FIG. 1, the greeting card comprises a paper or cardboard-based card 101 that is folded to produce a customary folded card. A pair of loudspeakers 102a and 102b are installed in the card, such as one in each interior fold or flap of the card, as shown. A control circuit 103, such as embodied in a printed circuit board or similar circuit is mounted within the card to playback through the speakers 102a and 102b one or more sound files stored in memory. The circuit may also include or be coupled to a switch that activates the circuit when the card is opened. Small batteries provide power to the circuit 103. The circuit 103 and any connected or included batteries may be installed in the card in any appropriate manner, such as sandwiched between paper sheets making up the card, or surface mounted in the inner or outer portion of the card. Likewise, speakers 102a and 102b may be mounted in any appropriate position of the card to provide two-way audio imaging for playback of the audio file or files. The speakers may be placed near the outside edge of each inner page of the card (as shown) to maximize separation of the two audio channels (for stereo audio) or to provide some element of depth (for mono). Other positions within the card are also possible. For immersive (spatial) audio content that has height cues, an array of speakers (such as four speakers may be used, such that speakers located on the upper portion of the card playback the elevation sound objects.

The card 101 may be a folded card or any other similar product such as a brochure, promotional material, single page flyer or leaflet, and so on. The card may be made of paper, cardboard, thin plastic sheet, stiff cloth or fiber, thin wood veneer or any other similar material. The audio content may be music, messages, sound effects, etc., and is generally a relatively short duration clip to allow storage on small on-board memory. The speakers 102a, 102b may be thin profile speakers that fit inside a fold of paper, and may be on the order of 2 to 7 cm, or any appropriate size, and may be circular (disc-shaped), rectangular, or any appropriate shape. The power is typically provided by a lithium-ion (hearing aid) battery or similar type of battery.

For the embodiment of FIG. 1, circuit 103 comprises a switch to activate the audio playback, memory to store the audio, and a logic circuit or component to playback the audio through the speakers 102a, 102b, and one or more batteries to power the circuit, though batteries may also be provided separately in the card and connected to circuit 103 through wires or conductive connectors. The circuit 103 is tuned to correct for deficiencies of the original audio sound clips when played through small speakers and in a non-resonant medium, such as a paper card. The tuning process takes objective measurements of the acoustic properties of the card and provides these to a tuning component. The tuning component then generates tuning coefficients for pre-processing algorithms to modify the original audio clip, such as through compression and equalization effects.

Audio cards with small speakers generally do not have a flat frequency response curve, and thus sound distorted. Furthermore, there is typically very little bass response (high bass roll-off). With regard to compensating for the greeting card deficiencies, the goal is generally to achieve a flat speaker with response and enhance the inherent low fidelity associated with cards and similar media. The tuning process uses knowledge of how the card sounds to improve the sound output. The tuning circuit measures the speaker output characteristics and applies equalization to produce a flat response so the sound is not as distorted, and adds compression to make up for low sound levels to make the sound clearer. The tuning circuit also adds speaker virtualization to make the speakers sound more immersive.

The tuning process thus comprises equalization (frequency enhancement) to provide frequency response correction and compression (volume enhancement) to increase low volume response. If an array of speakers is provided (e.g., two or more speakers), the tuning process adds virtualization effects to playback spatial audio through virtualization for audio objects. This tuning is generally provided as a pre-process during production based on the configuration (dimensions/material) of the card, the audio content, and the number and configuration of speakers at the manufacturing stage, such as when the card is assembled or produced.

Figure 2:
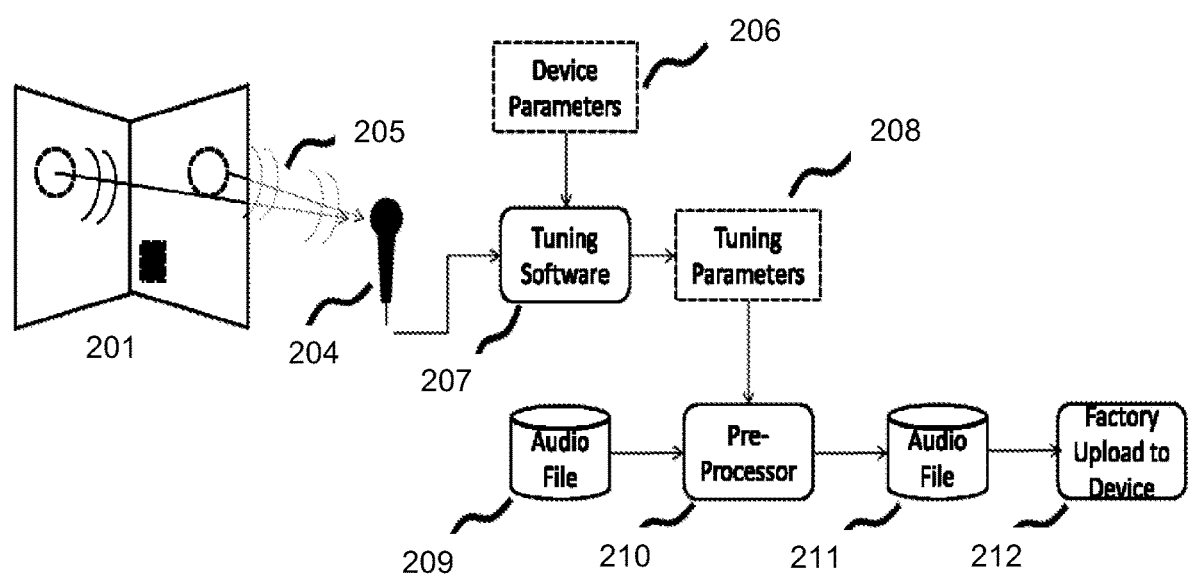
FIG. 2 illustrates components of a tuning process for tuning an audio circuit of a greeting card for playback through embedded stereo speakers, under some embodiments.

FIG. 2 illustrates components of a tuning process for tuning an audio circuit of a greeting card for playback through embedded stereo speakers, under some embodiments. As shown for audio greeting card 201, a reference microphone 204 is used to measure the audio response from the two speakers 205 in the card as it plays the stored audio file 209. The captured audio is analyzed along with device parameters 206, such as card dimensions and distance between loudspeakers, by the tuning software 207. The tuning software is designed to observe and correct any deficiencies in the playback of audio file 209 ("original audio file") and output tuning parameters 208, which takes the form of coefficients to control a pre-processor 210. The pre-processor 210 outputs a processed stereo audio file 211 ("processed audio file"), which can be uploaded 212 to the memory on the control circuit. Any appropriate method can be used to upload the file or program the control circuit, such as through flashing of an EEPROM, or other similar method. The original audio file is typically a digitized audio file such as a song, segment of music, dialog, and so on.

In an embodiment, the pre-processor 210 comprises a set of linear filters and nonlinear compression components. The linear filters applies gains that equalize the audio file signal as played through microphone 204 to produce a flat response, or any desired response curve, such as a boosted bass or boosted mid-range signal. In most cases, however, the pre-processor is set to apply gains that produce a flat frequency response. The nonlinear/dynamic filter applies compression that boosts overly weak signals and attenuates overly high signals to boost or normalize an overall volume of the audio file.

Figure 3:
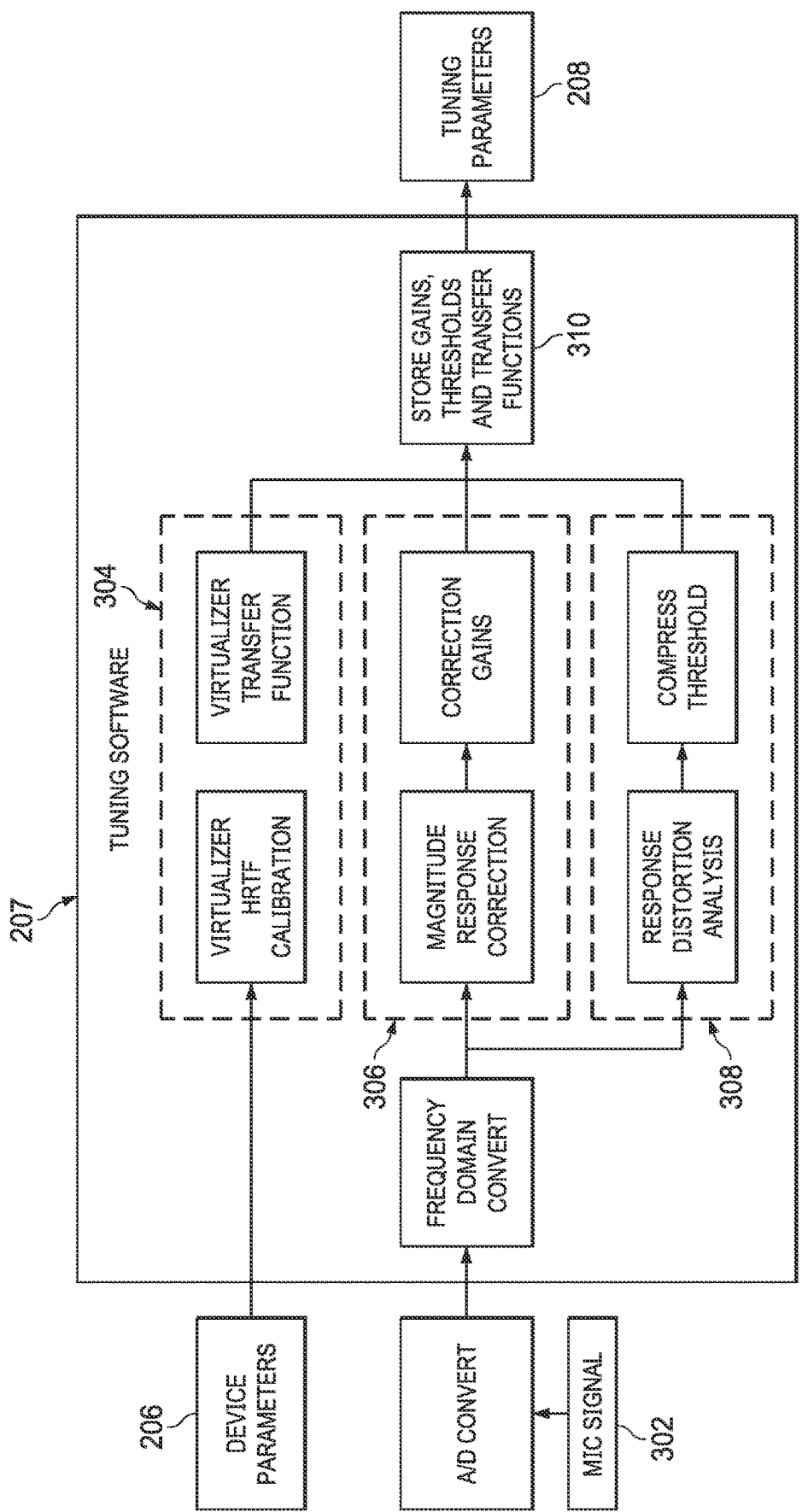
FIG. 3 is a block diagram that illustrates functional components of the tuning software, under some embodiments.

FIG. 3 is a block diagram that illustrates functional components of the tuning software 207, under some embodiments. As shown in FIG. 3, the analog microphone 204 signal 302 is converted to digital in an analog-to-digital (A/D) converter and input to the tuning software component 207. The signal is converted from the time domain to the frequency domain and then input through two processing chains 306 and 308. Processing chain 306 comprises a magnitude response correction that generates correction gains to equalize the signal to provide flat frequency response, or any other desired response. Processing chain 308 comprises a system response distortion analysis component that generates compressor threshold values to level the amplitude of the signal across the frequency domain. The correction gains and compressor thresholds are stored using process 310.

For example, the original audio file may be nominally a stereo sound file. In general, virtualization allows playback of channel-based audio and spatial audio (e.g., cinematic sound content) can be pre-processed by the tuning software 207. This provides an immersive (e.g., Atmos) effect using a renderer, and the pre-processor of the card may include a virtualizer component and an array of at least two speakers. For this embodiment, the tuning software also includes processing chain 304 that includes a virtualizer HRTF (head related transfer function) calibration component that generates a virtualizer transfer function. In an embodiment, the virtualizer HRTF calibration component uses certain HRTF-processing functions that simulate surround sound playback from loudspeakers or headphones. In general, a head-related transfer function characterizes how a person's ear receives a sound from a point in space; a pair of HRTFs for two ears can be used to synthesize a binaural sound that seems to come from a particular point in space. The HRTF transfer function describes how a sound from a specific point will arrive at the ear. This transfer function is also stored along with the gains and thresholds from processing chains 306 and 308. The stored gains, thresholds, and transfer functions are then used to create the tuning parameters 208.

In general, the virtualization transfer function for a virtualizer and/or EQs may be derived as described in the following paragraphs.

For instance, a speaker separation angle may be calculated using the separation of loud speakers on a card, which itself may be a function of the card width, and the assumed listening distance of a person holding the card. For example if a pair of speakers are 10 cm either side of the fold of the card, and the assumed listening distance is 40 cm then the assumed angle from the listener to either speaker is approximately 14 degrees.

The speaker angle is then used to derive the virtualization main transfer function using a database of proprietary or publicly available HRTFs. The pre-processing system may calculate a compensation transfer function to modify the playback path to be closer to the ideal location of the speakers—for example to model a home theatre setup. In a home theatre the front speakers may be placed at +/−45-degrees, the surround speakers at +/−135-degrees. Thus, the calculated compensation transfer function may be dependent on the card size, which affects the speaker location and the assumed listener position.

The compensation transfer functions make assumptions on the frequency response of the greeting card. Resonances and frequency distortions in the greeting card may be corrected such that cross talk effects of the speakers are applied equally to the stereo image. Resonant peaks in the frequency response may be minimized by digital filters in the pre-processing system. The coefficients for the filters may be calculated based on knowledge of the resonant properties of the card—derived by the dimensions and properties of the material—or by acoustic measurements.

Figure 4:
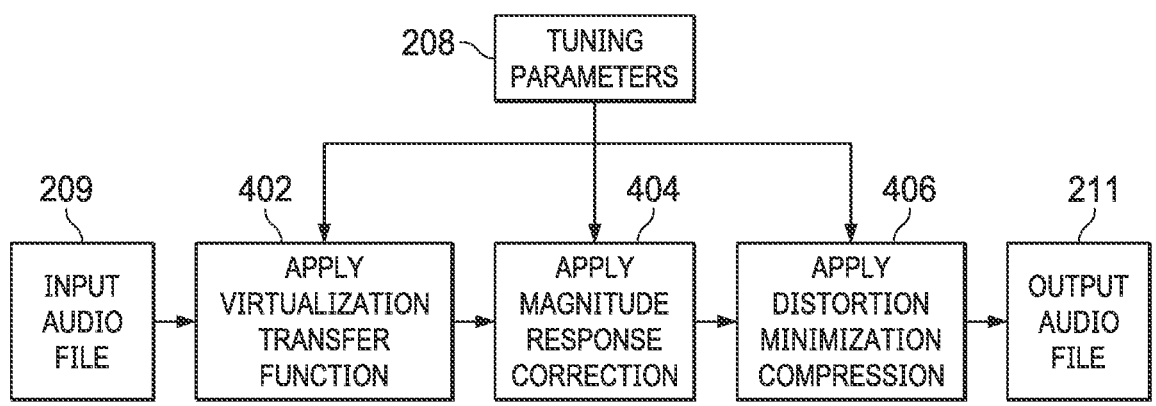
FIG. 4 is a flow diagram illustrating the application of tuning parameters to an original input audio file, under some embodiments.

FIG. 4 is a flow diagram illustrating the application of tuning parameters to an original input audio file, under some embodiments. As shown in FIG. 4, the tuning parameters 208 comprising the virtualization transfer function 402, the magnitude response correction gains 404, and the distortion minimization compression factors 406 are each applied to the input audio file (original file) 209 to produce the processed or output audio file 211. The order of application of the tuning parameters generally does not matter, as the tuning parameters generally represent a set of gains (positive or negative) applied to specified frequency bands of the input audio file. Once a tuning parameter set 208 has been established for a particular audio file and product, it can be applied or reused on many different of audio files for use in the same product family. For example, a particular song being played on the same or similar run of greeting cards.

In an embodiment, different tuning curves can be generated to enhance the audio or account for the sound processor being embedded in different media (e.g., card or brochure). For example, the response curve for the tuning can be customized the response based on the same song played back in different media, such as promotional movie clips packaged in a card versus a brochure or booklet, or cards with different types or sizes of speakers. The tuning response can thus be changed to enhance certain frequencies from a flat response to mid-boosted, bass-heavy, and so on.

Figure 5:
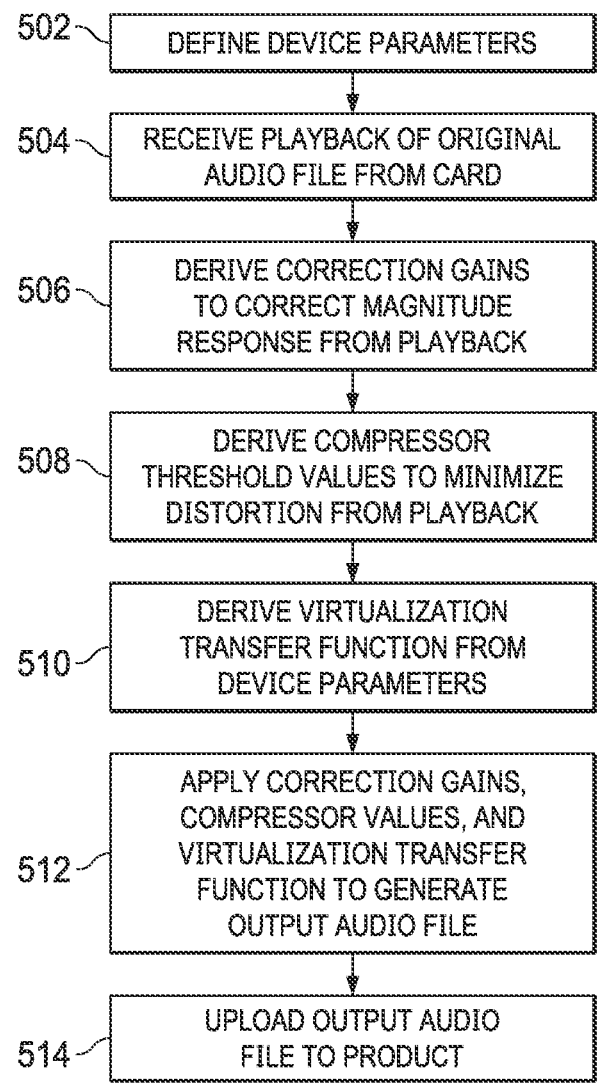
FIG. 5 is a flowchart that illustrates an overall process of pre-processing a greeting card to optimize audio output quality for spatial audio playback, under some embodiments.

FIG. 5 is a flowchart that illustrates an overall process of pre-processing a greeting card to optimize audio output quality for spatial audio playback, under some embodiments. The overall process of FIG. 5 illustrates a process of measuring the audio response of a card to get a good tuning set of parameters, and based on certain parameters, applying the tuning parameters to the original audio file to get new audio file for use in production cards. As shown in FIG. 5, certain device (card product) parameters are defined, such as card size/material, speaker size/type, speaker placement and distance, card angle of opening, and so on. The original audio file is played through a microphone and receiver system to provide audio sampling data, which provides frequency response and level information, 504. This information is used to generate tuning parameters including correction gains 506 to correct the magnitude response such as to produce a flat frequency response, and compressor threshold values to minimize distortion due to unbalanced volume levels in the playback, 508. For spatial or immersive audio content, the tuning parameters also include a virtualization transfer function that is derived from the device parameters, 510. The tuning parameters are then applied to the original audio file to generate a processed output audio file, 512. This processed audio file can then be uploaded or programmed into the greeting card or cards to provide corrected audio based on the form factor of the card and optimized for playback of immersive audio content 514.

In an embodiment, a watermark technique can be used to detect or validate the pre-processing of the output audio file. For this embodiment, the system uses a signature audio signal (watermark) to stamp the pre-processed audio file. Comparing an original file to an output audio file can be used to detect if the file has been pre-processed through the presence of the watermark. The watermark can be embodied by putting a signal in the out-of-band portion of the signal with respect to speaker playback. For example by encoding a signature audio signal (e.g., a beep or other sound pattern) in the very low bass region (e.g., below 200 Hz) of the input audio file.

Embodiments of the pre-processing method and system allow the use of many different channel and object audio configurations to be used as the audio source file at the input to the pre-processor. Mono, stereo, multichannel (such as 5.1 or 7.1) and object audio (such as Dolby Atmos) can be provided to the pre-processor, which uses the tuning parameters to correct and enhance the audio to maximize the perceptual quality during playback on the card. An array of one or more loudspeakers provides a stereo playback environment. To further enhance the audio from the card the control or playback circuit uses post-processing technologies based on real-time playback of content to derive gain-based tuning parameters to overcome problems of poor audio quality on the low cost form factor of the audio greeting card.

It should be noted that although embodiments are described with respect to certain example configurations and implementations, other configurations are also possible in keeping with the various embodiments described herein.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

Various aspects of the present invention may be appreciated from the following enumerated example embodiments (EEEs):

EEE 1. A method of pre-processing audio for playback through a greeting card having at least one speaker and an audio control circuit, comprising:
    measuring an audio response from the at least one speaker;
    analyzing the measured audio response with one or more device parameters related to playback from the greeting card;
    comparing the analyzed audio response with an original audio file; and
    generating tuning coefficients for input to the audio control circuit to apply to the original audio file to correct for audio playback deficiencies associated with the one or more device parameters.

EEE 2. The method of EEE 1 wherein the greeting card comprises a paper card folded in half to form an inner surface and an outer surface, and the at least one speaker comprises two speakers placed such that each speaker is in an opposite interior fold of the greeting card to project sound to a listener when the card is opened.

EEE 3. The method of EEE 2 wherein the one or more device parameters comprises a size of each speaker, a distance between the two speakers, a composition of the two speakers, a material of the card, a weight of the material, and a dimension of the card.

EEE 4. The method of any of EEEs 1 to 3 wherein the original audio file is a digitized sound file comprising one of: a stereo audio file, a channel-based audio file, an object-based audio file, and a spatial audio file.

EEE 5. The method of EEE 4 further comprising applying gain values through linear filters and compression through nonlinear filters to correct for frequency distortion and suboptimal volume levels of the original audio file when played through the one or more speakers.

EEE 6. The method of EEE 5 further comprising applying a virtualization transfer function derived from a head related transfer function (HRTF) to optimize playback of object or spatial audio through the one or more speakers.

EEE 7. The method of EEE 1 wherein the audio content comprises spatial audio having certain height cue audio components, and wherein the one or more speakers comprises an array of speakers having at least some speakers playing the height cue audio components.

EEE 8. The method of EEE 1 further comprising watermarking the processed file by adding a signature audio signal to an out-of-band portion of the audio playback range of the one or more speakers.

EEE 9. The method of any of EEEs 2 through 8 further comprising:
generating an output file after application of the tuning coefficients to the original audio file; and
programming the output file into other greeting cards for production of the greeting card.

EEE 10. A method of pre-processing audio for playback through an audio greeting card having at a speaker array of two or more speakers and an audio control circuit, comprising:
defining one or more device parameters associated with the greeting card;
measuring an audio response from the greeting card when playing an original audio file;
deriving correction gains to correct magnitude response characteristics of the audio response;
deriving compressor threshold values to minimize level distortion of the audio response;
deriving a virtualization transfer function from the one or more device parameters; and
applying the correction gains, compressor threshold values, and the virtualization transfer function to generate an output audio file.

EEE 11. The method of EEE 10 wherein the correction gains create a flat frequency response for the output audio file when played through the speaker array of the greeting card.

EEE 12. The method of any of EEEs 10 and 11 wherein the compressor threshold values create a non-distorted volume response for the output audio file when played through the speaker array of the greeting card.

EEE 13. The method of EEEs any of EEEs 10 to 12 wherein the virtualization transfer function comprises a head related transfer function (HRTF) that simulates surround sound playback from the speaker array of the greeting card.

EEE 14. The method of EEE 13 wherein the original audio file is a digitized sound file comprising one of: a stereo audio file, a channel-based audio file, an object-based audio file, and a spatial audio file.

EEE 15. The method of EEE 14 wherein the spatial audio file includes audio objects representing height cues, and wherein the speaker array comprises at least one speaker providing playback of height objects.

EEE 16. The method of any of EEEs 10 to 15 wherein the one or more device parameters comprises a size of each speaker of the speaker array, a distance between the speakers, a composition of the speakers, a material of the card, a weight of the material, and a dimension of the card.

EEE 17. The method of EEE 10 wherein the correction gains, compressor threshold values, and virtualization transfer function comprise tuning parameters for modifying the original audio file.

EEE 18. The method of EEE 17 further comprising applying the tuning parameters to other greeting cards related to the greeting card and programmed to playback the original audio file.

EEE 19. A greeting card comprising:
one or more speakers for playback of a sound file
a battery to power playback of sound;
a memory storing a digitized version of the sound file; and
a control circuit tuned to correct deficiencies in playback of the sound file, through a process comprising: measuring audio response from the at least one speaker, deriving from the measured audio response correction gains to correct magnitude response characteristics of the audio response and compressor threshold values to minimize level distortion of the audio response, defining one or more device parameters and deriving a virtualization transfer function from the one or more device parameters.

EEE 20. The greeting card of EEE 19 wherein the one or more device parameters comprises a size of each speaker of the speaker array, a distance between the speakers, a composition of the speakers, a material of the card, a weight of the material, and a dimension of the card.

EEE 21. The greeting card of EEE 20 wherein the one or more speakers comprises a speaker array of at least two speakers.

EEE 22. The greeting card of EEE 21 wherein the original audio file is a digitized sound file comprising one of: a stereo audio file, a channel-based audio file, an object-based audio file, and a spatial audio file.

EEE 23. The greeting card of EEE 22 wherein the spatial audio file includes audio objects representing height cues, and wherein the speaker array comprises at least one speaker providing playback of height objects.

EEE 24. The greeting card of any of EEEs 19 to 23 wherein the correction gains create a flat frequency response for the output audio file when played through the one or more speakers.

EEE 25. The greeting card of any of EEEs 19 to 24 wherein the compressor threshold values create a non-distorted volume response for the output audio file when played through the one or more speakers.

EEE 26. The greeting card of any of EEEs 19 to 25 wherein the virtualization transfer function comprises a head related transfer function (HRTF) that simulates surround sound playback from the one or more speakers.

The invention claimed is:

1. A method of pre-processing audio for playback through a greeting card having at least one speaker and an audio control circuit, comprising:
measuring an audio response from the at least one speaker;
analyzing the measured audio response with one or more device parameters related to playback from the greeting card;
comparing the analyzed audio response with an original audio file; and
generating tuning coefficients for input to the audio control circuit to apply to the original audio file to correct for audio playback deficiencies associated with the one or more device parameters.

2. The method of claim 1 wherein the greeting card comprises a paper card folded in half to form an inner surface and an outer surface, and the at least one speaker comprises two speakers placed such that each speaker is in an opposite interior fold of the greeting card to project sound to a listener when the card is opened, and wherein the one or more device parameters comprises a size of each speaker, a distance between the two speakers, a composition of the two speakers, a material of the card, a weight of the material, and a dimension of the card.

3. The method of claim 2 further comprising:
applying gain values through linear filters and compression through nonlinear filters to correct for frequency distortion and suboptimal volume levels of the original audio file when played through the one or more speakers; and
applying a virtualization transfer function derived from a head related transfer function (HRTF) to optimize playback of object or spatial audio through the one or more speakers.

4. The method of claim 1 wherein the original audio file is a digitized sound file comprising one of: a stereo audio file, a channel-based audio file, an object-based audio file, and a spatial audio file.

5. The method of claim 4 wherein the audio content comprises spatial audio having certain height cue audio components, and wherein the one or more speakers comprises an array of speakers having at least some speakers playing the height cue audio components.

6. The method of claim 1 further comprising watermarking the processed file by adding a signature audio signal to an out-of-band portion of the audio playback range of the one or more speakers.

7. The method of claim 1 further comprising:
generating an output file after application of the tuning coefficients to the original audio file; and
programming the output file into other greeting cards for production of the greeting card.

8. A method of pre-processing audio for playback through an audio greeting card having at a speaker array of two or more speakers and an audio control circuit, comprising:
defining one or more device parameters associated with the greeting card;
measuring an audio response from the greeting card when playing an original audio file;
deriving correction gains to correct magnitude response characteristics of the audio response;
deriving compressor threshold values to minimize level distortion of the audio response;
deriving a virtualization transfer function from the one or more device parameters; and
applying the correction gains, compressor threshold values, and the virtualization transfer function to generate an output audio file.

9. The method of claim 8 wherein the correction gains create a flat frequency response for the output audio file when played through the speaker array of the greeting card, and further wherein the compressor threshold values create a non-distorted volume response for the output audio file when played through the speaker array of the greeting card, and wherein the one or more device parameters comprises a size of each speaker of the speaker array, a distance between the speakers, a composition of the speakers, a material of the card, a weight of the material, and a dimension of the card, and further wherein the correction gains, compressor threshold values, and virtualization transfer function comprise tuning parameters for modifying the original audio file.

10. The method of claim 8 wherein the original audio file is a digitized sound file comprising a spatial audio file including audio objects representing height cues, and wherein the speaker array comprises at least one speaker providing playback of height objects, and wherein the virtualization transfer function comprises a head related transfer function (HRTF) that simulates surround sound playback from the speaker array of the greeting card.

11. A greeting card comprising:
one or more speakers for playback of a sound file
a battery to power playback of sound;
a memory storing a digitized version of the sound file; and
a control circuit tuned to correct deficiencies in playback of the sound file, through a process comprising: measuring audio response from the at least one speaker, deriving from the measured audio response correction gains to correct magnitude response characteristics of the audio response and compressor threshold values to minimize level distortion of the audio response, defining one or more device parameters and deriving a virtualization transfer function from the one or more device parameters.

12. The greeting card of claim 11 wherein the device parameter related to playback from the greeting card comprises a size of each speaker of the speaker array, a distance between the speakers, a composition of the speakers, a material of the card, a weight of the material, and a dimension of the card, and wherein the one or more speakers comprises a speaker array of at least two speakers.

13. The greeting card of claim 11 wherein the original audio file is a digitized sound file comprising one of: a stereo audio file, a channel-based audio file, an object-based audio file, and a spatial audio file, and wherein the spatial audio file includes audio objects representing height cues, and wherein the speaker array comprises at least one speaker providing playback of height objects.

14. The greeting card of claim 11 wherein the correction gains create a flat frequency response for the output audio file when played through the one or more speakers, and wherein the compressor threshold values create a non-distorted volume response for the output audio file when played through the one or more speakers.

15. The greeting card of claim 11 wherein the virtualization transfer function comprises a head related transfer function (HRTF) that simulates surround sound playback from the one or more speakers.

16. The method of claim 1, wherein the one or more speakers comprises a speaker array of at least two speakers, and wherein the one or more device parameters comprises at least one of a size of each speaker of the speaker array, a distance between the speakers, a composition of the speakers, a material of the card, a weight of the material, or a dimension of the card.

* * * * *